United States Patent

Combs

[15] 3,667,045

[45] May 30, 1972

[54] CHASSIS AND MONITORING ARRANGEMENT FOR ELECTRICAL APPARATUS

[72] Inventor: Jimmy Paul Combs, Palatine, Ill.

[73] Assignee: Motorola, Inc., Franklin Park, Ill.

[22] Filed: June 25, 1970

[21] Appl. No.: 49,699

[52] U.S. Cl. ................................325/15, 325/355, 325/356, 317/101 R, 339/17 LC, 339/17 M

[51] Int. Cl. ........................................................H04b 1/38

[58] Field of Search....................325/15, 111, 119, 352, 353, 325/355, 356; 317/99, 100, 101 R, 101 CC, 101 DH; 339/17 LC, 17 M; 179/1 PC

[56] References Cited

UNITED STATES PATENTS

| | | | |
|---|---|---|---|
| 3,345,568 | 10/1967 | Errichiello et al. | 325/356 |
| 3,406,368 | 10/1968 | Curran | 339/17 M |
| 3,413,594 | 11/1968 | Fernald et al. | 339/17 LC |

*Primary Examiner*—Robert L. Griffin
*Assistant Examiner*—Albert J. Mayer
*Attorney*—Mueller and Aichele

[57] ABSTRACT

Electrical apparatus including components on plurality of chassis boards each having conductors thereon forming electrical circuits. The boards may be secured in cooperative relationships on a frame or housing structure, with the boards having portions in overlying relation with disengageable connecting means for interconnecting the circuits on the boards. The electrical equipment may be a mobile radio receiver and transmitter, with one board being a control board and the other boards coupled thereto having the radio receiver and radio transmitter components thereon. The control board has a connector thereon for making external connections to the circuit thereof, which is interconnected to the circuits on the receiver and transmitter boards. The control, receiver and transmitter boards are accessible for servicing, and have sockets for receiving a control plug and a test plug from a test set for monitoring the signals in the circuits. The individual chassis boards can be replaced without removing the housing from the vehicle in which it is installed.

11 Claims, 6 Drawing Figures

PATENTED MAY 30 1972

3,667,045

INVENTOR.
JIMMY PAUL COMBS
BY Mueller & Aichele
ATTORNEYS.

PATENTED MAY 30 1972 3,667,045

SHEET 2 OF 3

INVENTOR.
JIMMY PAUL COMBS
BY Mueller & Aichele
ATTORNEYS

INVENTOR
JIMMY PAUL COMBS

BY Mueller & Aichele
ATTORNEYS

CHASSIS AND MONITORING ARRANGEMENT FOR ELECTRICAL APPARATUS

BACKGROUND OF THE INVENTION

Complex electrical apparatus has been constructed by providing various portions on separate chassis boards, with a connecting arrangement for interconnecting the boards to provide a complete operating unit. To conserve space, the boards are sometimes arranged as plug-in units positioned parallel to each other, but this arrangement does not afford access to the sides of the boards when in their operating positions so that testing and servicing can be accomplished.

Radio apparatus, such as a radio transmitter and receiver, has also been constructed with a plurality of chassis which are interwired to provide a complete unit. This has the disadvantage that substantial assembly time is required in wiring the complete radio apparatus. Also, to replace one of the chassis requires relatively extensive wiring, so that substantial time is required. In such units, since it is desired to be able to monitor signals in the circuits, centralized monitoring has been provided which has the advantage that a single plug from a test set can be inserted in the socket on the equipment to provide all test and monitoring facilities. However, as the equipment becomes more complex it is desired to use different chassis arrangements in different applications, and this required extensive wiring of the socket to the various different chassis of the equipment. Further, when additional accessory chassis are added, there may not be sufficient contacts in the socket for all the test points desired.

SUMMARY OF THE INVENTION

It is an object of this invention to provide an improved multiple chassis mounting, connecting and monitoring arrangement for complex electrical apparatus.

Another object of the invention is to provide a chassis arrangement for a radio transmitter and receiver which makes it possible to interconnect a plurality of chassis, and monitor the signals therein without extensive wiring of the chassis to each other and to the monitoring facilities.

A further object of the invention is to provide a chassis arrangement for a mobile radio transmitter and receiver including a plurality of chassis boards arranged to detachably interconnect with each other to permit replacing an individual board without removing the radio from a vehicle.

A still further object of the invention is to provide a multiple chassis electronic apparatus with a plurality of chassis boards each having a socket connected to test points on the chassis board for controlling the equipment and testing the same, when the boards are in operative relation in the apparatus, and for testing a board when removed from the apparatus.

Still another object of the invention is to provide a multiple chassis arrangement for a mobile radio transmitter and receiver wherein all adjustable elements are positioned on the chassis so that they are accessible when the equipment is in operating relation.

In accordance with the invention, complex electrical apparatus, such as a mobile radio receiver and transmitter, is provided by a plurality of chassis circuit boards mounted on a frame or housing structure, with portions of the boards overlying each other and having disengageable connecting means therebetween. One board is a control board and has a main connector thereon for receiving a mating connector for making external connections to the apparatus. The other boards have portions overlying the control board with pins secured thereto which extend into connector clips on the control board. All connections are made through the control board except for a limited number of special connections, such as the connection from the radio transmitter and receiver to the antenna.

The control board and other boards have test sockets thereon, with contacts connected to various test points on the circuit so that the circuit on each board can be checked, both when the boards are connected together in operative relation, and when a board has been removed for servicing. All adjustable components are positioned on the boards so that they are accessible so that the radio equipment can be aligned when installed in the vehicle. The chassis boards can also be individually replaced when required without removing the radio from the vehicle in which it is installed. The chassis boards can be used in various different arrangement with the test socket for each board attached thereto.

DESCRIPTION OF THE PREFERRED EMBODIMENT

Figure 1:
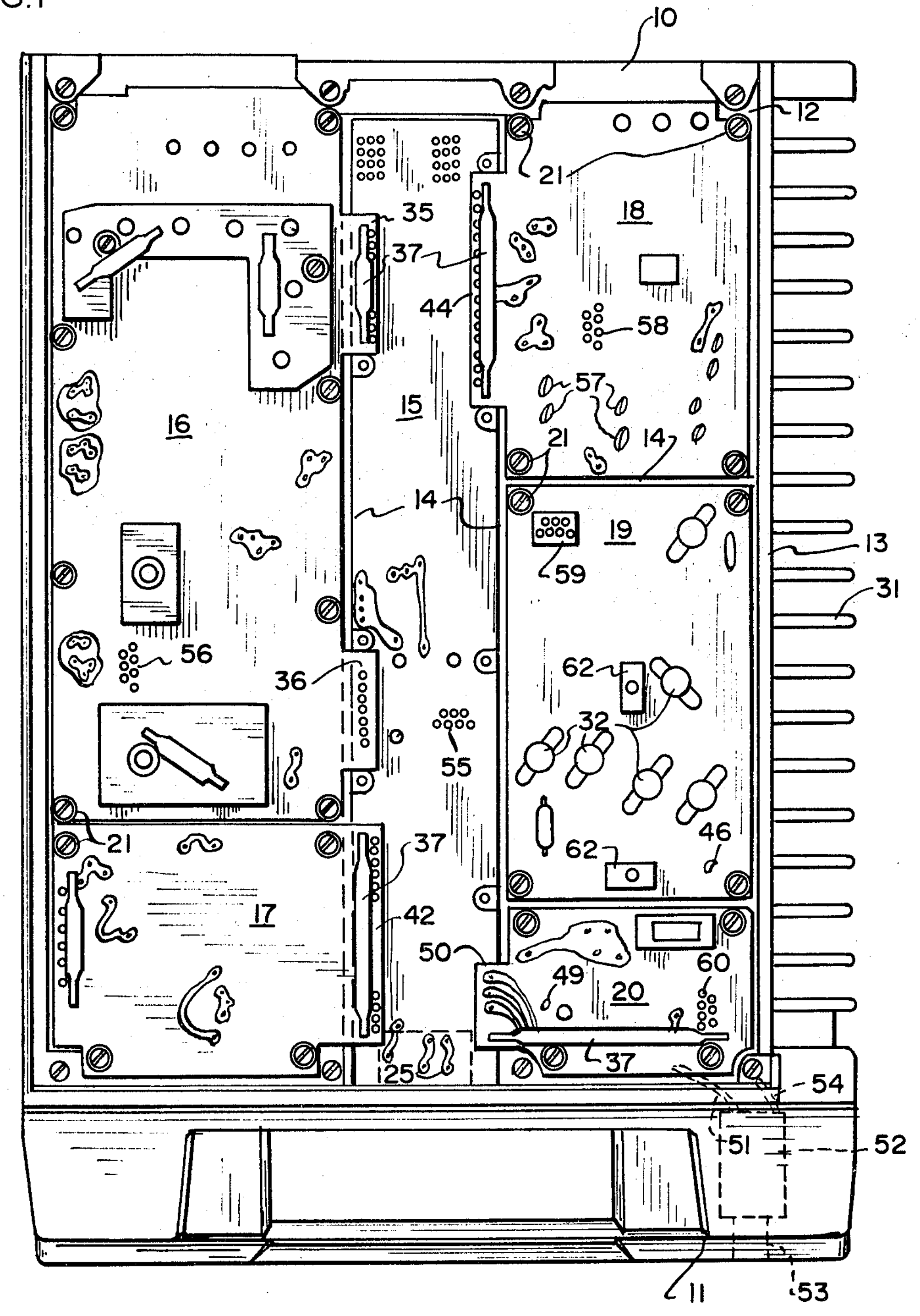
FIG. 1 is a top view of a radio transmitter and receiver chassis structure in accordance with the invention.
Figure 2:
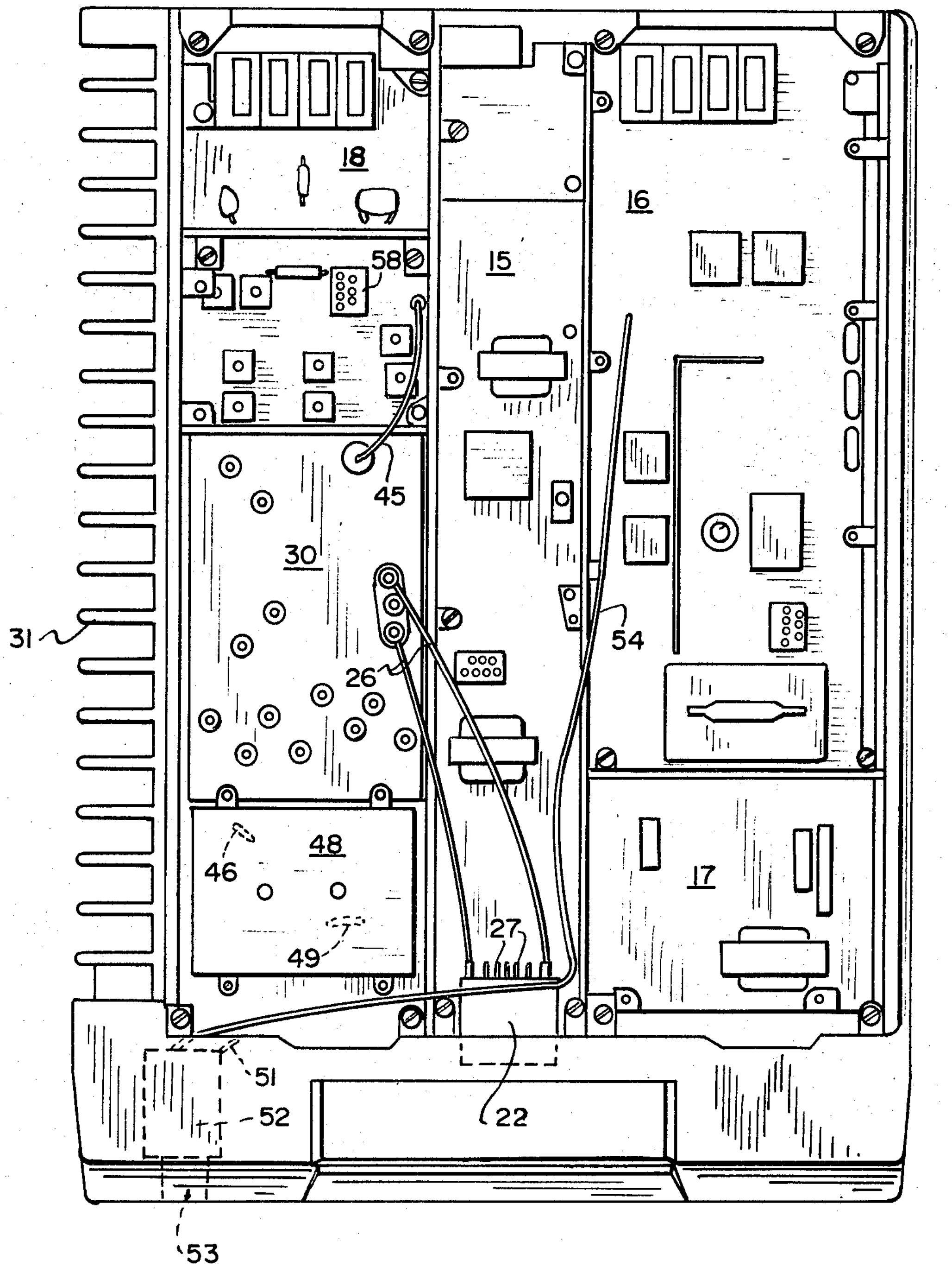
FIG. 2 is a bottom view of the chassis structure of FIG. 1.

The radio transmitter and receiver including the chassis arrangement of the invention is shown in FIG. 1 and FIG. 2 supported on a frame or housing 10 adapted to be installed in a vehicle. The housing 10 includes mounting projections 12 for supporting chassis 15, 16, 17, 18, 19, and 20. The chassis are removably secured by fasteners 21 which engages the mounting projections 12. Each of these chassis is formed by an insulating board with conductors thereon, and components mounted thereon. The frame 10 has a rectangular outer edge 13 and internal struts 14 which support and separate the chassis. A front housing 11 is secured to the frame 10 and has a handle for carrying the radio.

Figure 4:
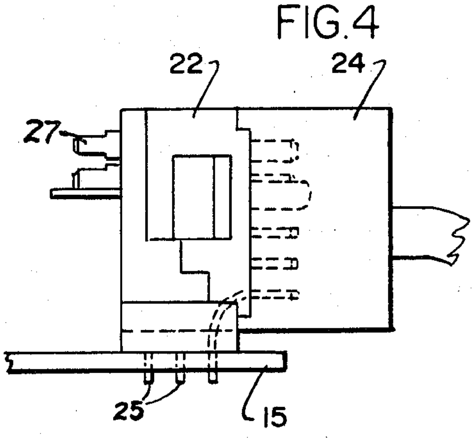
FIG. 4 shows the main connector on the control board.

Chassis 15 is a control board or panel to which connections are made from external circuits through main connector 22 (FIGS. 2 and 4). Boards 16 and 17 form the principle components of the receiver, with board 16 including the radio frequency and intermediate frequency stages, and board 17 including the audio circuits. Boards 18 and 19 form the transmitter with board 18 including the exciter portion thereof and board 19 the power amplifier. Board 20 is the power control board which connects the transmitter circuit to the antenna for the radio.

FIG. 4 shows the main connector 22 for the apparatus to which connections are made by a mating connector 24. The radio may be installed in a vehicle and connector 24 is connected to a cable extending to the control head and the battery of the vehicle. Conductors within the connector 22 extend at right angles, with ends 25 extending through the board 15 and soldered to circuits thereon, as shown in FIG. 4. Other conductors extend through the connector 22 and have terminals 27 which can be connected to elements on the circuit boards, or to auxiliary components which may be used with the radio. Power connections are also made from connector 22 to the power amplifier chassis 19 by conductors 26, as shown in FIG. 2.

In FIGS. 1 and 2, only some of the components are illustrated on the boards 15, 16, 17, 18, 19 and 20 to simplify the drawings. In general, the printed circuit conductors are provided on the top sides of the boards (FIG. 1) and the components are mounted on the bottom sides of the boards (FIG. 2). The boards are positioned in parallel planes as shown, being only slightly displaced from each other so that portions of some of the boards can overlie the control board 15, and this arrangement provides access to both sides of the board. However, the components which are adjustable for aligning the equipment are accessible from the top side of the chassis boards. The power amplifier board 19 is mounted on a shelf 30 (FIG. 2) which is integral with heat sink 31 forming one side of the frame, so that heat from the power transistors 32 of the power amplifier 19 is conducted to the heat sink and radiated therefrom. The power transistors are directly mounted on the shelf 30 to provide an effective heat conduction path.

Figure 5:
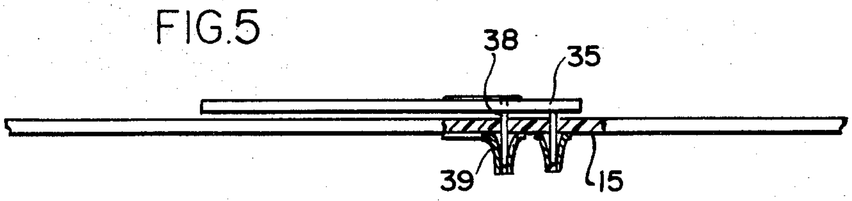
FIG. 5 is a cross section view showing the interconnection between chassis.

As shown in FIG. 1, connections are made between the chassis boards 16, 17, 18 and 20, and the control board 15 by projecting portions of the boards 16, 17, 18 and 20 which overlie the board 15. More specifically, chassis 16 includes two projecting portions 35 and 36 which extend over parts of the control board 15. These projecting portions have conducting pins therein which extend in socket clips in the control board 15. This is illustrated in FIG. 5 wherein the pins 38 in the projecting portion 35 are in engagement with spring clips 39 on the control board 15. The pins 38 and the clips 39 may be directly soldered to connecting strips on the chassis boards. Insulating straps 37 are secured to the projecting portions of the boards to facilitate disconnecting the same from the control board.

The audio board 17, which also includes the squelch circuit for the receiver, has a projecting portion 42 with pins extending in socket clips in the control board 15. Similarly, the exciter board 18 has a projecting portion 44 having pins which extend into socket clips in the control board 15. It is therefore apparent that when the boards 16, 17 and 18 are mounted in the housing, the pins thereon can be inserted in the sockets in the control board 15 to interconnect the circuits on the chassis 16, 17 and 18 with the circuit on the chassis 15, and interwiring of the chassis boards is completely eliminated. This makes it possible to replace the boards, as may be required for servicing, without removing the radio from the vehicle in which it is installed.

The power amplifier board 19 is not interconnected to the control board 15, as are the chassis boards 16, 17, 18 and 20. As shown in FIG. 2, the output of the exciter 18 is directly connected to the power amplifier 19 through conductor 45. Also, as previously stated, power is supplied from the main connector 22 to the power amplifier 19 through conductors 26. The output of the power amplifier 30 is connected to harmonic filter 48 by a conductor 46 (FIG. 1) extending from the power amplifier into the harmonic filter 48, on the bottom side of the chassis (FIG. 2). The harmonic filter 48 is connected to the power control board 20 by conductor 49 which extends from the harmonic filter 48 to the power control board 20.

The power control board 20 has a portion 50 which overlies the control board 15, with pins connected to the circuit of board 20 engaging socket clips secured to board 15 and connected to the circuit thereof. In some radio equipment the pin and socket connections between boards 20 and 15 may not be required. The power control board couples the transmitter output through conductor 51 to an antenna switch or relay 52 having an output provided by coaxial connector 53. The switch 52 is supported on frame 10 and is positioned within the front housing 11, and the coaxial connector 53 is at the front of housing 11 to facilitate connection of an antenna thereto. The receiver is also connected to the antenna switch 52 by a conductor 54 (FIG. 2). The antenna switch 52 connects the receiver to an antenna for reception, and connects the transmitter to the antenna for transmission, as is well understood in the art.

The control panel 15 includes a control socket 55 thereon, and the receiver chassis 16 has a test socket 56, the exciter panel 18 has a test socket 58, the power amplifier panel 19 has a test socket 59, and the power control board 20 has a test socket 60. These sockets make it possible to control and test the chassis forming the receiver and transmitter, both when they are in operative position in the housing 10, and when they have been removed for servicing. As previously stated, the individual chassis can be removed without removing the housing from the vehicle in which it is installed.

Figure 6:
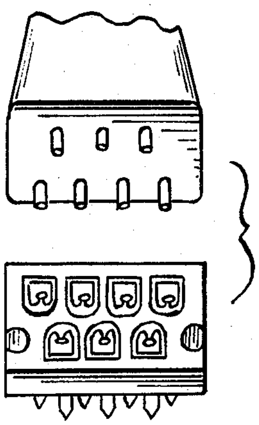
FIG. 6 illustrates the plug and socket for connection of the test set to the chassis.

The test plug and socket are shown in FIG. 6. The structure of the test socket is such that the test plug may enter from either side of the chassis. However, it is not possible to use both sides with the same test plug connection since this would provide different connections when the test plug engages the socket from the opposite sides.

Figure 3:
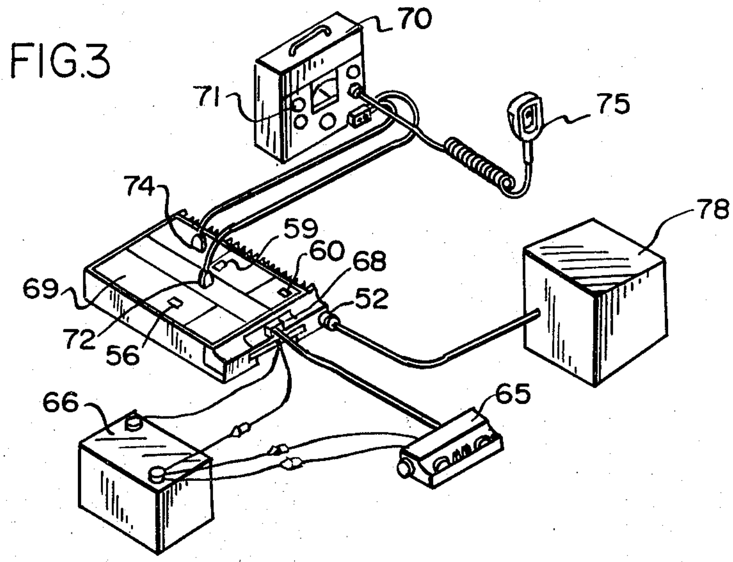
FIG. 3 illustrates the connections to the chassis of FIG. 1 for testing the same.

FIG. 3 illustrates a test set up which may be used for test purposes. A control head 65 and a battery 66 are connected to connector 68 which mates with the main connector 22 mounted on the control panel (FIGS. 2 and 4). This may be similar to the connector 24 which is used in an actual installation of the radio in a vehicle. Test set 70 may be used and has a control cable with a terminating plug 72 which can be inserted into the control socket 55 in the control panel. A test cable extending from the test set has a plug 74 thereon for connecting into the test sockets in one of the other chassis, such as socket 58 of the exciter chassis board 18. Shields 69 are provided above the various circuit boards, which together with the frame extending about the boards shields the circuits thereon. The shields are shown in FIG. 3, and have openings through which the test plug 74 may be inserted to engage the test socket. The test set has a selector switch 71 which may be set for various testing operations, and may include other controls. The test set also includes a meter for reading voltages at various test points. The exciter has adjustable elements 57 accessible from the top (FIG. 1) which can be set to provide the desired operation.

It is apparent that additional chassis boards can be added to the equipment and each can have a test socket for monitoring signals in the circuit thereof. Provisions can be made for connecting such additional board or boards to one of the other chassis boards or to the main connector 22, as required.

For test purposes any one of a number of different items can be connected to the antenna connector 53 for different tests. For example, for testing the transmitter, as shown in FIG. 3, a watt meter may be connected to the antenna terminal 53 to measure the power output. It may also be desired to use an antenna or a dummy antenna for various tests. Although, a microphone 75 is shown connected to the test set for providing signals for test purposes, an audio oscillator may also be used for this purpose. For testing the transmitter the test plug 74 may also be connected in test socket 59 for the power amplifier 19, or test socket 60 of the power control board 20. The power amplifier 19 has adjustable components 62 which are accessible from the top for alignment, and other chassis boards may have adjustable components similarly positioned.

When testing the receiver, the test plug 74 is connected to the test socket 56 on the receiver chassis 17. A radio frequency signal generator may be provided at 78 connected to the antenna connector 53 for applying radio frequency signals to the receiver. It may also be desired to use a pulse generator in cooperation with the radio frequency signal generator for testing.

The mobile radio transmitter and receiver described has been found to be highly advantageous from manufacturing and maintenance standpoints. The various parts are provided on separate chassis boards which have plug and socket connectors for assembly without extensive interwiring. The individual boards can be tested, serviced, and replaced if necessary without removing the radio from the vehicle in which it is used. The construction makes it possible to add additional accessories to the radio and provides connections which can be used therefor.

I claim:

1. Electrical apparatus including in combination, a frame structure having mounting means thereon, a plurality of substantially flat electrical circuit boards extending in substantially parallel planes supported by said frame structure and having portions secured to said mounting means, one of said circuit boards being a control circuit board having edge portions with connecting means thereon, a plurality of the other of said circuit boards having edge portions adjacent to said edge portions of said control circuit board and having connecting means for engagement with said connecting means on said control circuit board, and connector means on a plurality of said circuit boards for making connections to the circuit thereon, said connector means on said control circuit board being connected to apply control signals thereto and said connector means on said other circuit boards being connected to monitor signals appearing in the circuits thereof.

2. Electrical apparatus in accordance with claim 1 wherein said circuit boards include insulating boards with conductors thereon and electrical components supported thereby, with said edge portions of said other circuit boards overlying said edge portions of said control circuit board.

3. Electrical apparatus in accordance with claim 1 wherein said connecting means on said circuit boards are formed by conducting pins on one circuit board and engaging spring clips on another circuit board.

4. Electrical apparatus in accordance with claim 1 wherein each of said connector means is formed by a socket mounted on the associated circuit board and having a plurality of contacts connected to the circuit thereof, each of said sockets being adapted to receive a multiple contact plug connected to a test instrument.

5. Radio apparatus including in combination, a frame structure adapted to be mounted in a vehicle and having mounting means thereon, a plurality of electrical circuit boards having components thereon supported by said frame structure and having portions secured to said mounting means, said circuit boards being mounted to provide access to said components while secured to said mounting means and to be removed from said frame structure without removing the same from the vehicle, one of said circuit boards being a control circuit board having electrical connecting means thereon, a second circuit board forming at least a part of a radio receiver and a third circuit board forming at least a part of a radio transmitter, said second and third circuit boards having portions adjacent to portions of said control circuit board and having electrical connecting means in engagement with said connecting means on said control circuit board, and connectors on said control circuit board and on said second and third circuit boards for making connections to the circuits thereon, said connectors on said circuit boards facilitating the connection to the circuits thereof for monitoring signals appearing in such circuits to thereby facilitate adjustment of said components on said circuit boards.

6. Radio apparatus in accordance with claim 5 wherein said first and second circuit boards contain radio receiver and radio transmitter circuits, respectively, and extend in a plane which is substantially parallel to the plane of said control circuit boards and have portions overlying portions of said control circuit boards, and said electrical connecting means of said first and second circuit boards each include a plurality of pins and said electrical connecting means on said control circuit board include spring clips for receiving said pins.

7. Radio apparatus in accordance with claim 5 wherein said connector on said control circuit board is connected to circuits thereon for applying signals through said connecting means to the circuits on said first and second circuit boards.

8. Radio apparatus in accordance with claim 7 including a main connector connected to said control circuit board for making a connection to external circuits, and connections extending from said main connector through said control circuit board and said connecting means to said first and second circuit boards.

9. Radio apparatus in accordance with claim 5 further including a front housing secured to said frame structure, antenna switch means within said front housing having a connector accessible for connecting an antenna thereto, and circuit means connecting said antenna switch means to said first and second circuit boards.

10. Radio apparatus in accordance with claim 9 wherein said circuit means connecting said antenna switch means to said radio transmitter circuit board includes a harmonic filter and a power control circuit board.

11. Radio apparatus in accordance with claim 10, wherein said power control board includes electrical connecting means for engagement with electrical connecting means on said control circuit board, and a connector for making connections to the circuits on said power circuit control board for monitoring signals therein.

* * * * *